US012690246B2

(12) United States Patent
Li et al.

(10) Patent No.: US 12,690,246 B2
(45) Date of Patent: Jul. 21, 2026

(54) SEMICONDUCTOR CONTACT AREA MATCHING

(71) Applicant: International Business Machines Corporation, Armonk, NY (US)

(72) Inventors: Juntao Li, Cohoes, NY (US); Ruilong Xie, Niskayuna, NY (US); Jingyun Zhang, Albany, NY (US); Kisik Choi, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 18/528,926

(22) Filed: Dec. 5, 2023

(65) Prior Publication Data

US 2025/0185314 A1 Jun. 5, 2025

(51) Int. Cl.
H10D 62/10 (2025.01)
H10D 30/01 (2025.01)
(Continued)

(52) U.S. Cl.
CPC ......... H10D 62/121 (2025.01); H10D 30/014 (2025.01); H10D 30/43 (2025.01); H10D 30/6735 (2025.01); H10D 30/6757 (2025.01); H10D 62/151 (2025.01); H10D 64/017 (2025.01); H10D 64/018 (2025.01); H10D 64/021 (2025.01); H10D 84/013 (2025.01); H10D 84/0147 (2025.01);
(Continued)

(58) Field of Classification Search
CPC .... H10D 62/121; H10D 30/014; H10D 30/43;
H10D 30/6735; H10D 30/6757; H10D 62/151; H10D 64/017; H10D 64/018; H10D 64/021; H10D 84/013; H10D 84/0147; H10D 84/0149; H10D 84/038; H10D 84/83; H10D 30/0198; H10D 30/501; H10D 64/251; B82Y 10/00
See application file for complete search history.

(56) References Cited

U.S. PATENT DOCUMENTS 11,417,767 B2    8/2022   Chang et al.
11,450,559 B2    9/2022   Chang et al.
(Continued)

FOREIGN PATENT DOCUMENTS

EP        4475190 A1  * 12/2024   ......... H10D 30/0198
EP        4480903 A2  * 12/2024   ............ H10W 20/20
WO   WO-2023227271 A1  * 11/2023   ........ H10W 20/0242

*Primary Examiner* — Mohammed Shamsuzzaman
(74) *Attorney, Agent, or Firm* — CANTOR COLBURN LLP; Samuel Waldbaum

(57) ABSTRACT

A semiconductor structure with matched frontside and backside source/drain contact areas is provided. The semiconductor structure includes a backside contact region, a first source/drain region disposed on the backside contact region, wherein a shared surface between the backside contact region and a backside of the first source/drain region forms a first contact area, inner spacers disposed on opposite sides of the first source/drain region, wherein the inner spacers control a size of first contact area, and a frontside interlayer dielectric disposed on the first source/drain region, wherein a shared surface between the frontside interlayer dielectric and a frontside of the first source/drain region forms a second contact area, wherein the size of the first contact area matches a size of the second contact area.

10 Claims, 17 Drawing Sheets

(51) Int. Cl.

| | |
|---|---|
| *H10D 30/43* | (2025.01) |
| *H10D 30/67* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ....... *H10D 84/0149* (2025.01); *H10D 84/038* (2025.01); *H10D 84/83* (2025.01)

(56) References Cited

U.S. PATENT DOCUMENTS

| | | | |
|---|---|---|---|
| 11,450,751 | B2 | 9/2022 | Su et al. |
| 11,532,714 | B2 | 12/2022 | Yu et al. |
| 2014/0087523 | A1* | 3/2014 | Basker .................. H10D 30/43 438/151 |
| 2019/0326405 | A1 | 10/2019 | Morrow et al. |
| 2021/0134721 | A1 | 5/2021 | Chiang et al. |
| 2021/0202385 | A1 | 7/2021 | Huang et al. |
| 2021/0305252 | A1 | 9/2021 | Chiang et al. |
| 2021/0305381 | A1 | 9/2021 | Chiang et al. |
| 2021/0351303 | A1 | 11/2021 | Ju et al. |
| 2021/0376071 | A1 | 12/2021 | Liu et al. |
| 2021/0376093 | A1 | 12/2021 | Chu et al. |
| 2022/0352256 | A1 | 11/2022 | Su et al. |
| 2023/0197569 | A1* | 6/2023 | Dewey ............... H10D 84/0149 257/401 |
| 2024/0072133 | A1* | 2/2024 | Xie ...................... H10D 30/014 |
| 2024/0096750 | A1* | 3/2024 | Liang .................. H10W 20/023 |
| 2024/0105768 | A1* | 3/2024 | Xie ...................... H10D 62/121 |
| 2024/0204048 | A1* | 6/2024 | Jun ...................... H10D 62/149 |
| 2024/0266409 | A1* | 8/2024 | Kang .................. H10D 64/251 |
| 2024/0274676 | A1* | 8/2024 | Lee .................... H10D 30/6729 |
| 2024/0290834 | A1* | 8/2024 | Lee ...................... H10D 84/811 |
| 2024/0421037 | A1* | 12/2024 | Zou ...................... H10W 20/20 |
| 2025/0015160 | A1* | 1/2025 | Liaw .................. H10D 30/0198 |
| 2025/0132161 | A1* | 4/2025 | Sung .................. H10D 30/0198 |
| 2025/0151362 | A1* | 5/2025 | Hong .................. H10D 64/254 |
| 2025/0261424 | A1* | 8/2025 | Arnold .............. H10D 30/6735 |
| 2026/0032960 | A1* | 1/2026 | Yeung ............... H10D 30/0198 |
| 2026/0090015 | A1* | 3/2026 | Sung .................. H10D 30/6729 |
| 2026/0107546 | A1* | 4/2026 | Xu ...................... H10D 64/256 |
| 2026/0123385 | A1* | 4/2026 | Chang .................. H10W 20/42 |

* cited by examiner

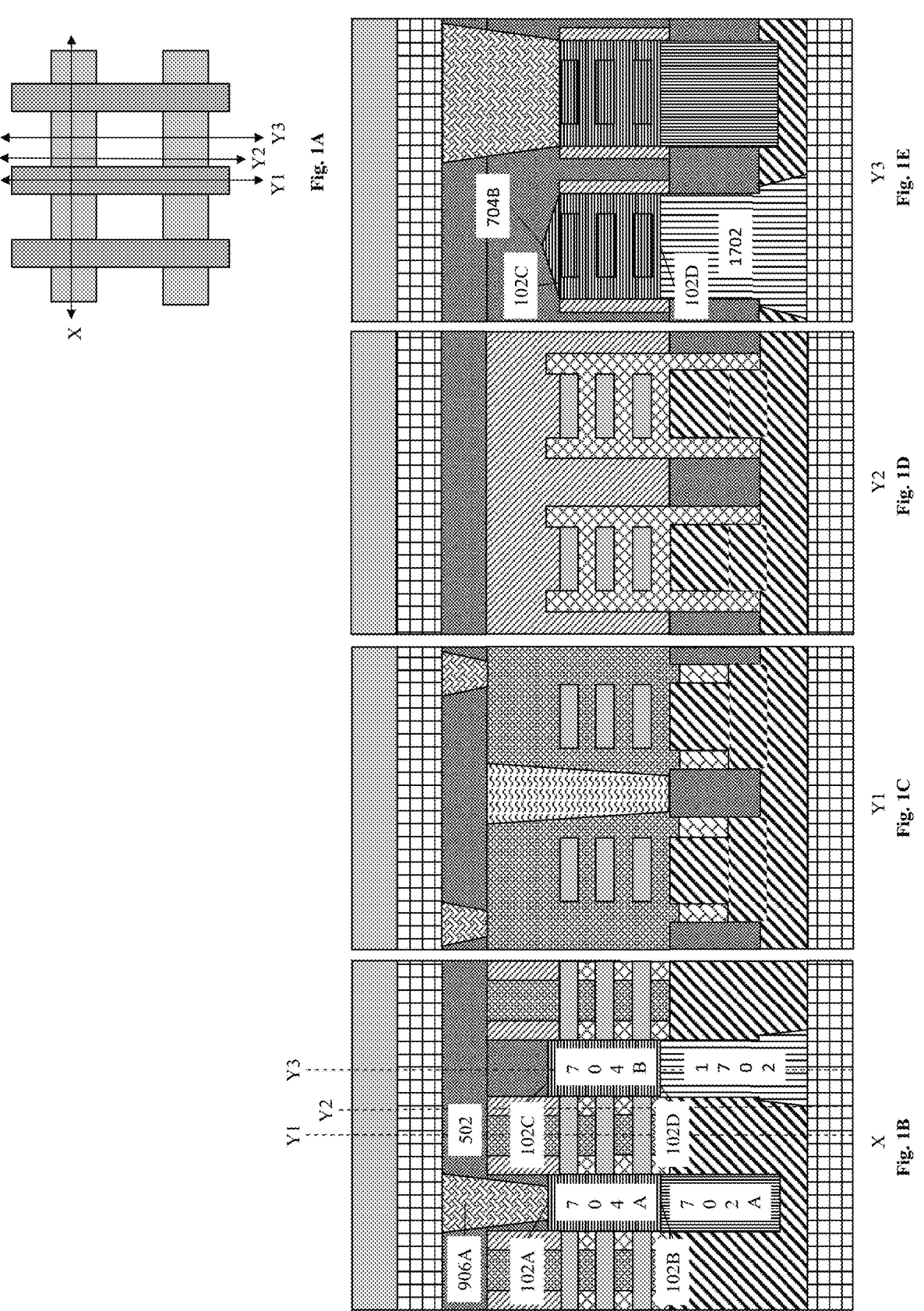

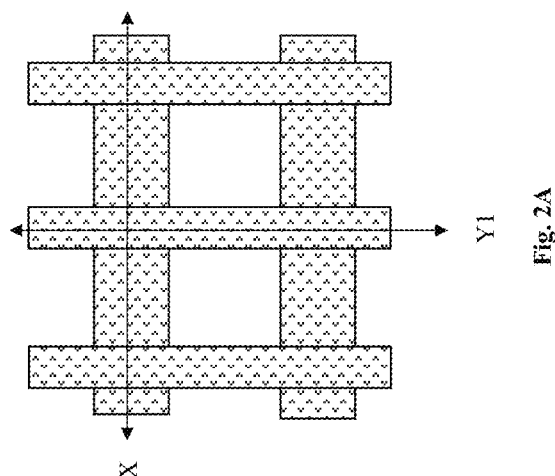
Fig. 2A
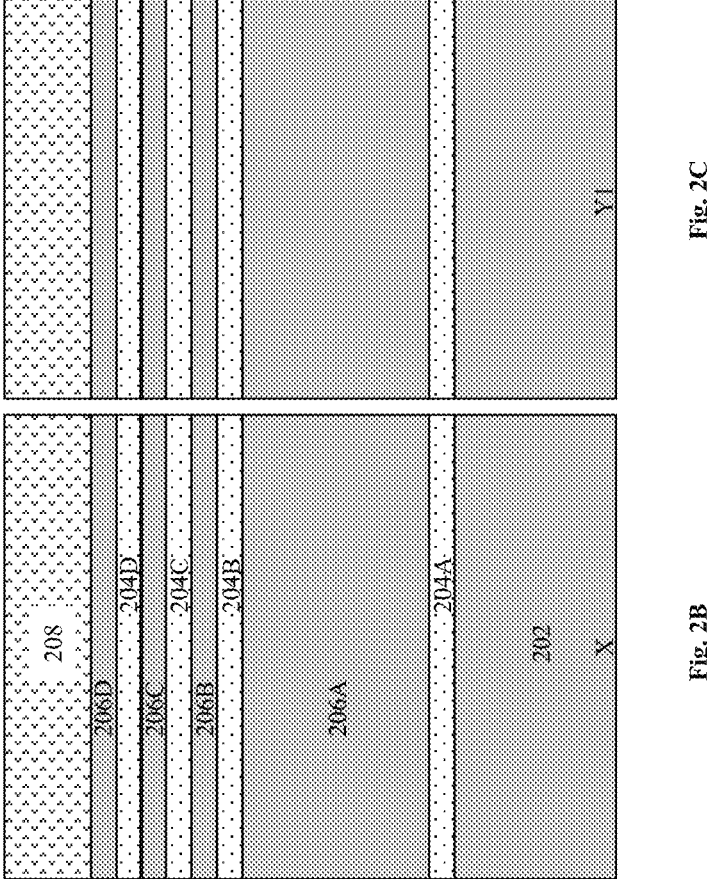
Fig. 2C
Fig. 2B

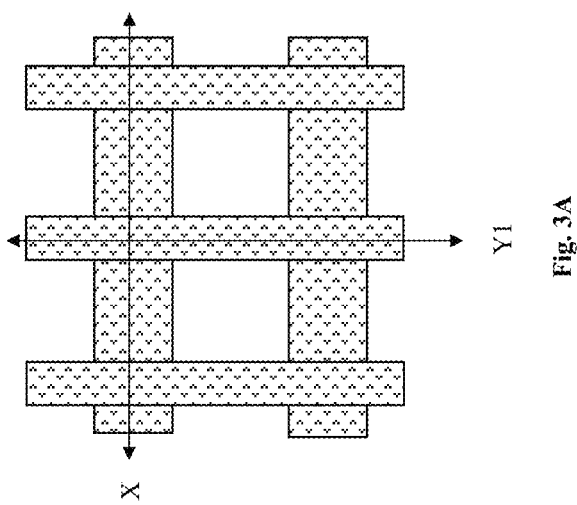
Fig. 3A
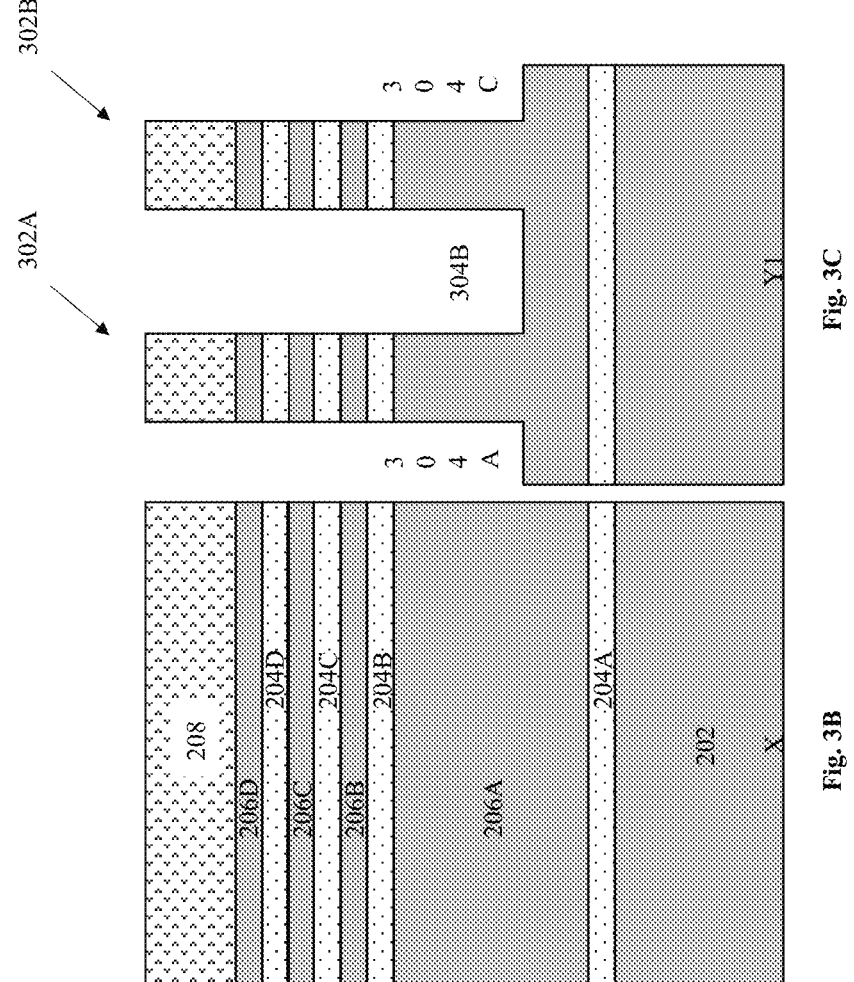
Fig. 3C
Fig. 3B

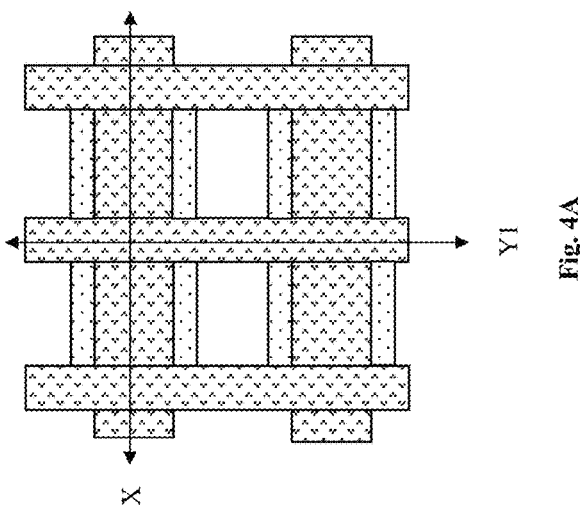
Fig. 4A
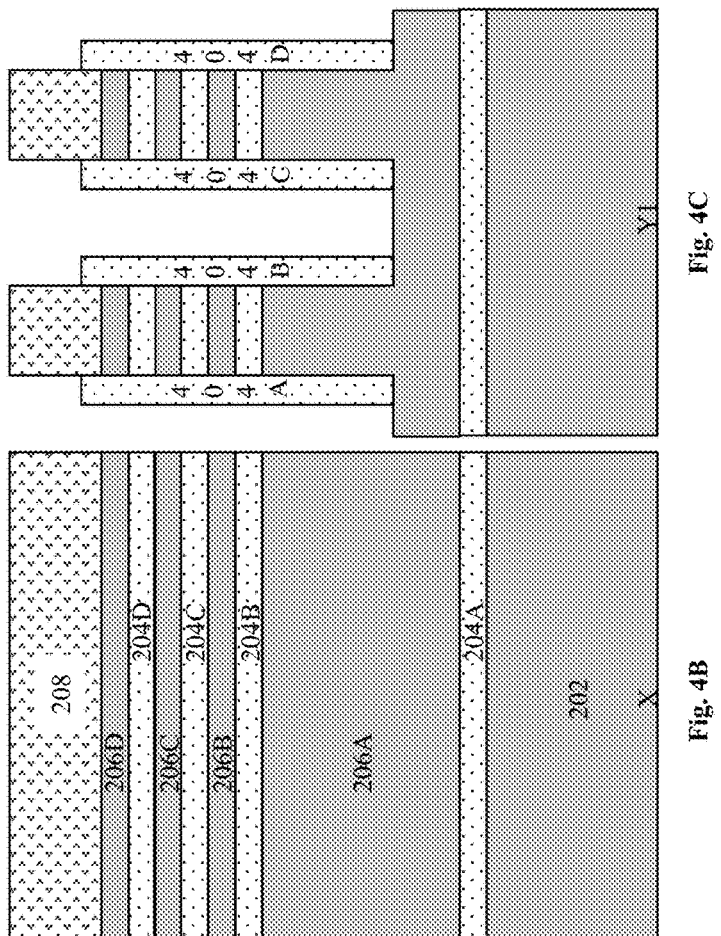
Fig. 4C
Fig. 4B

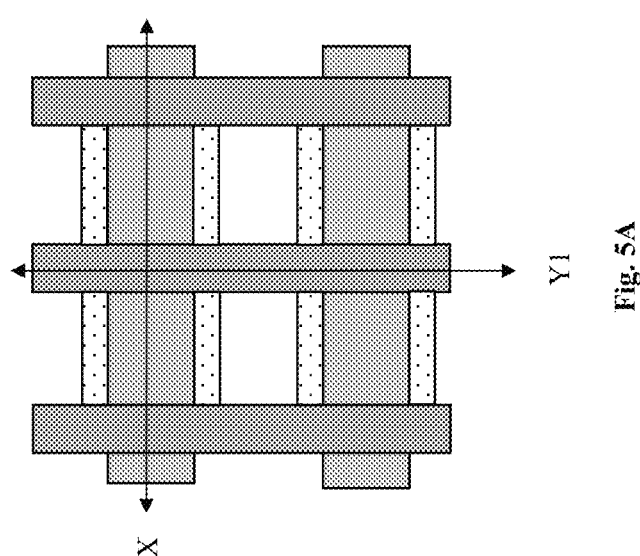
Fig. 5A
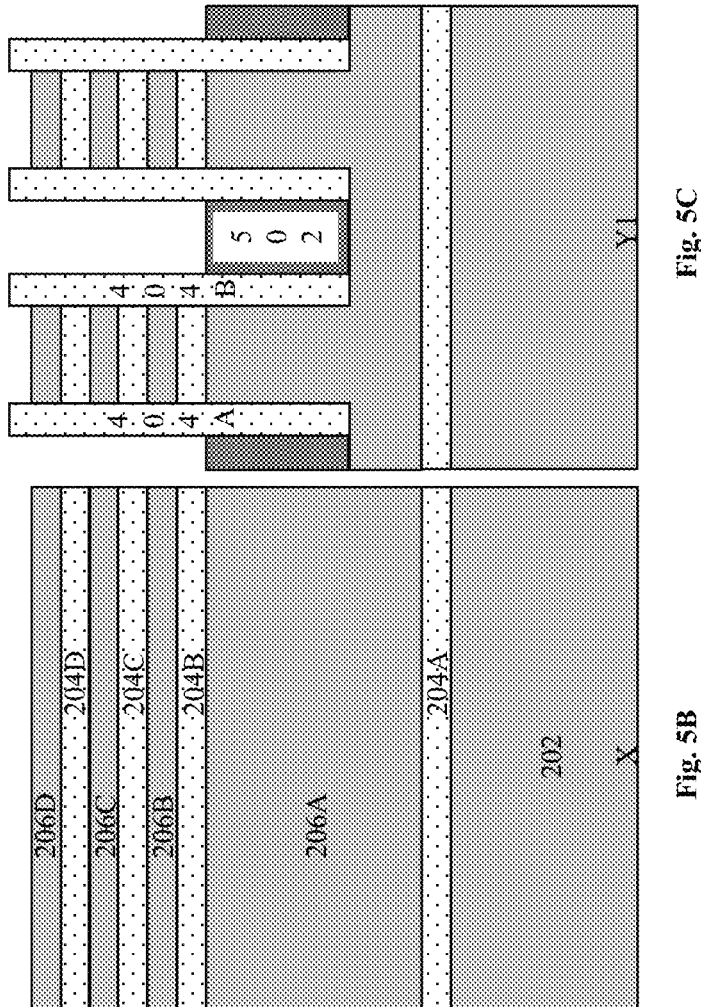
Fig. 5C
Fig. 5B

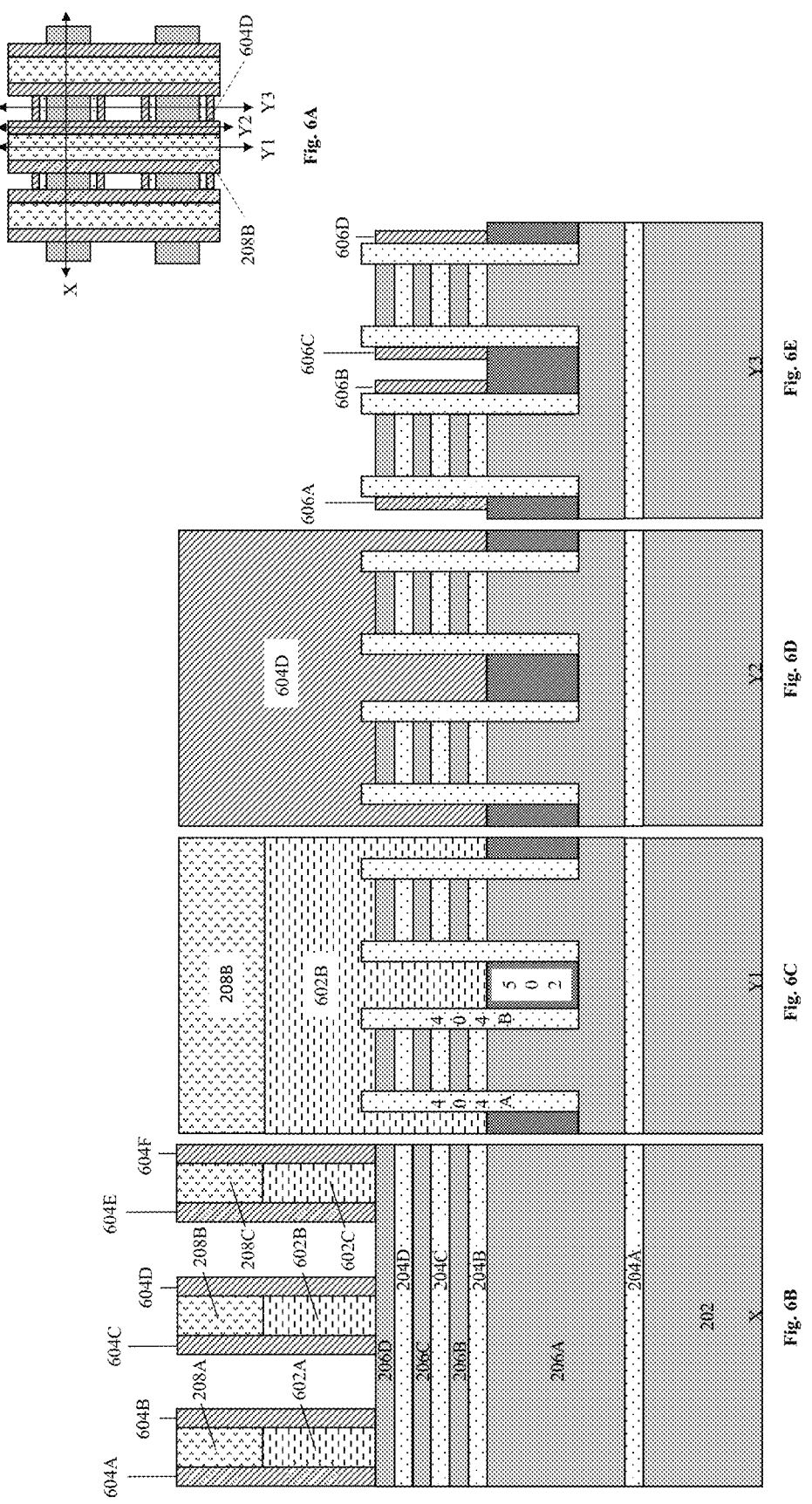

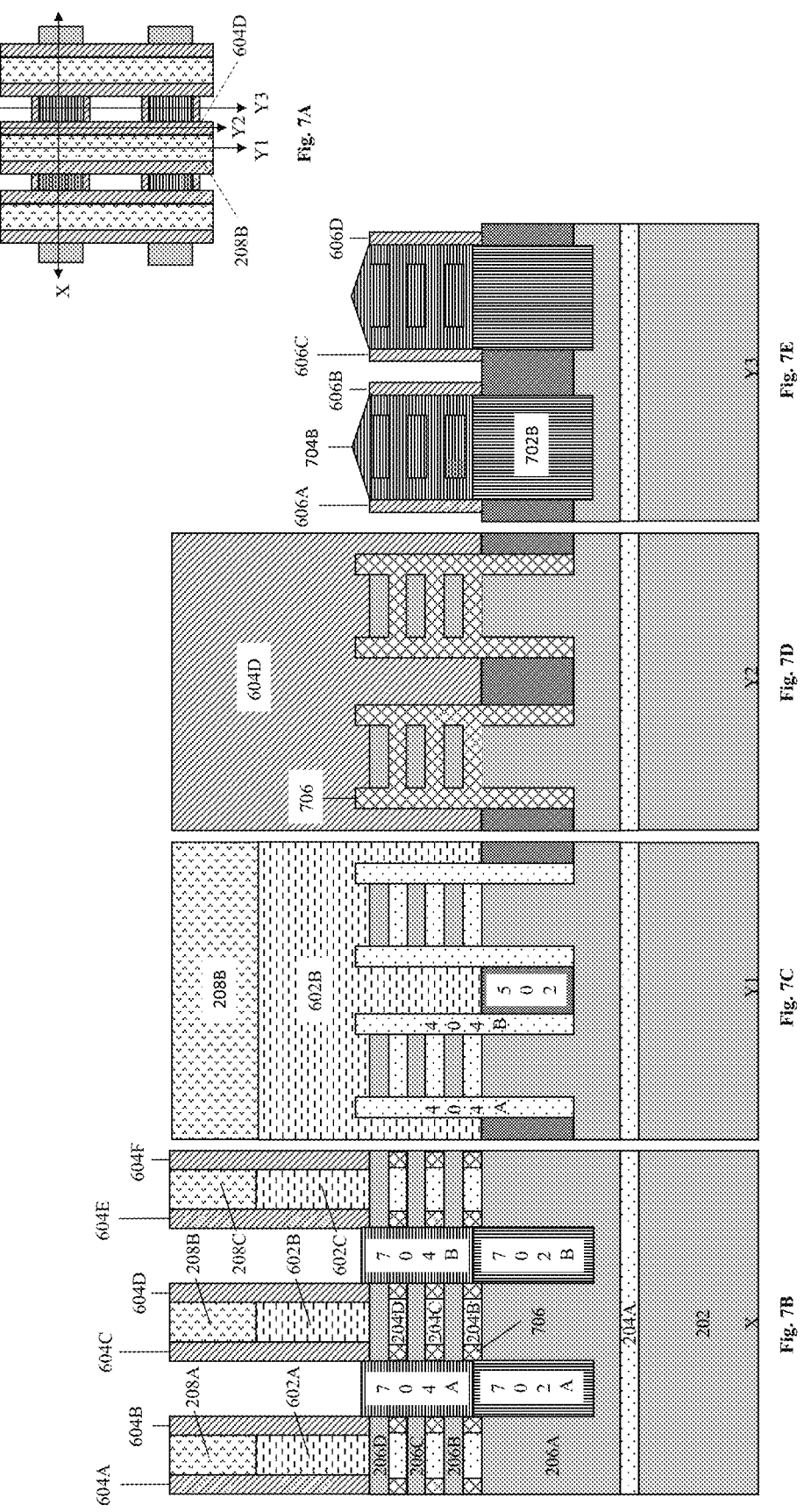

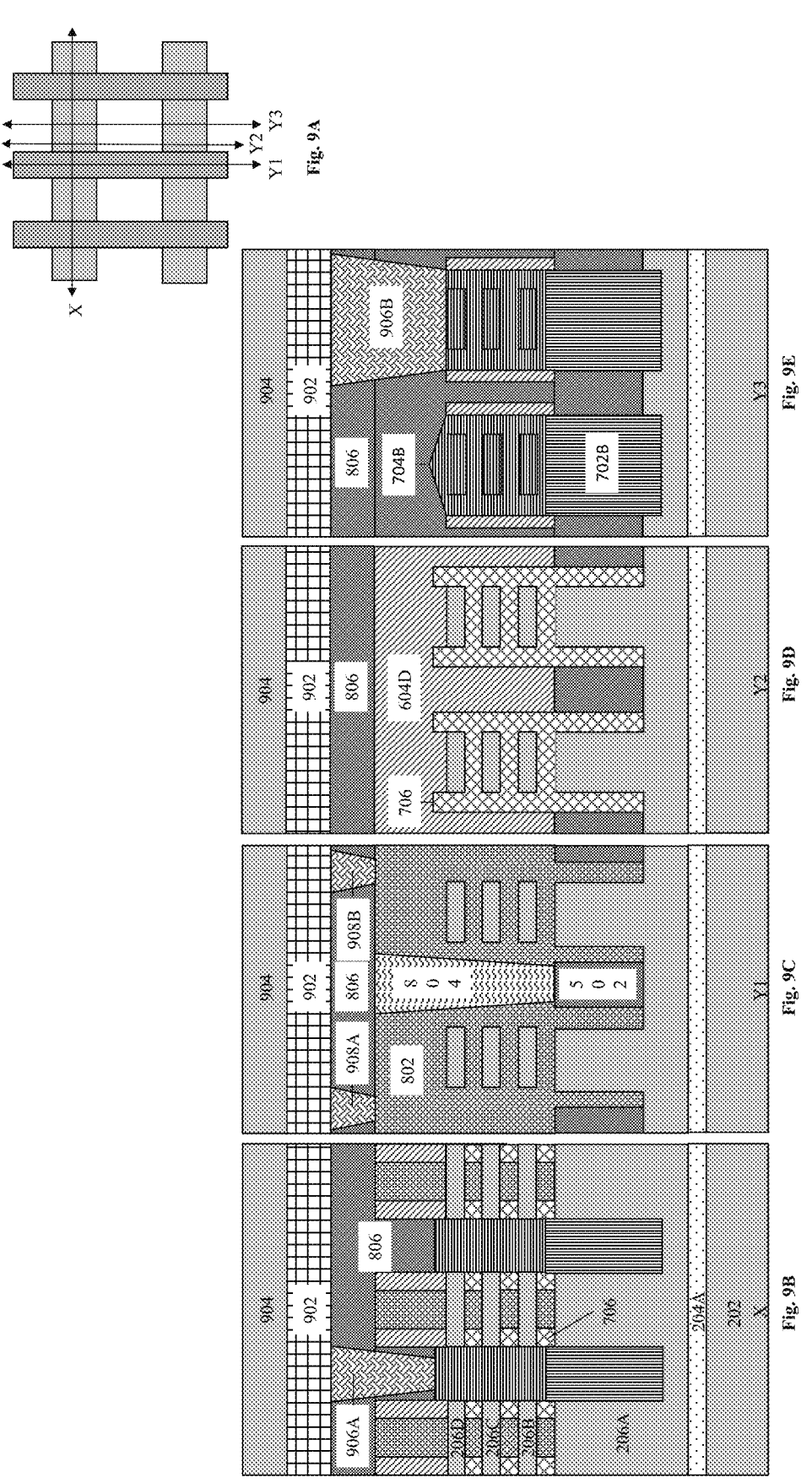

X

Y1

Y2

Y3

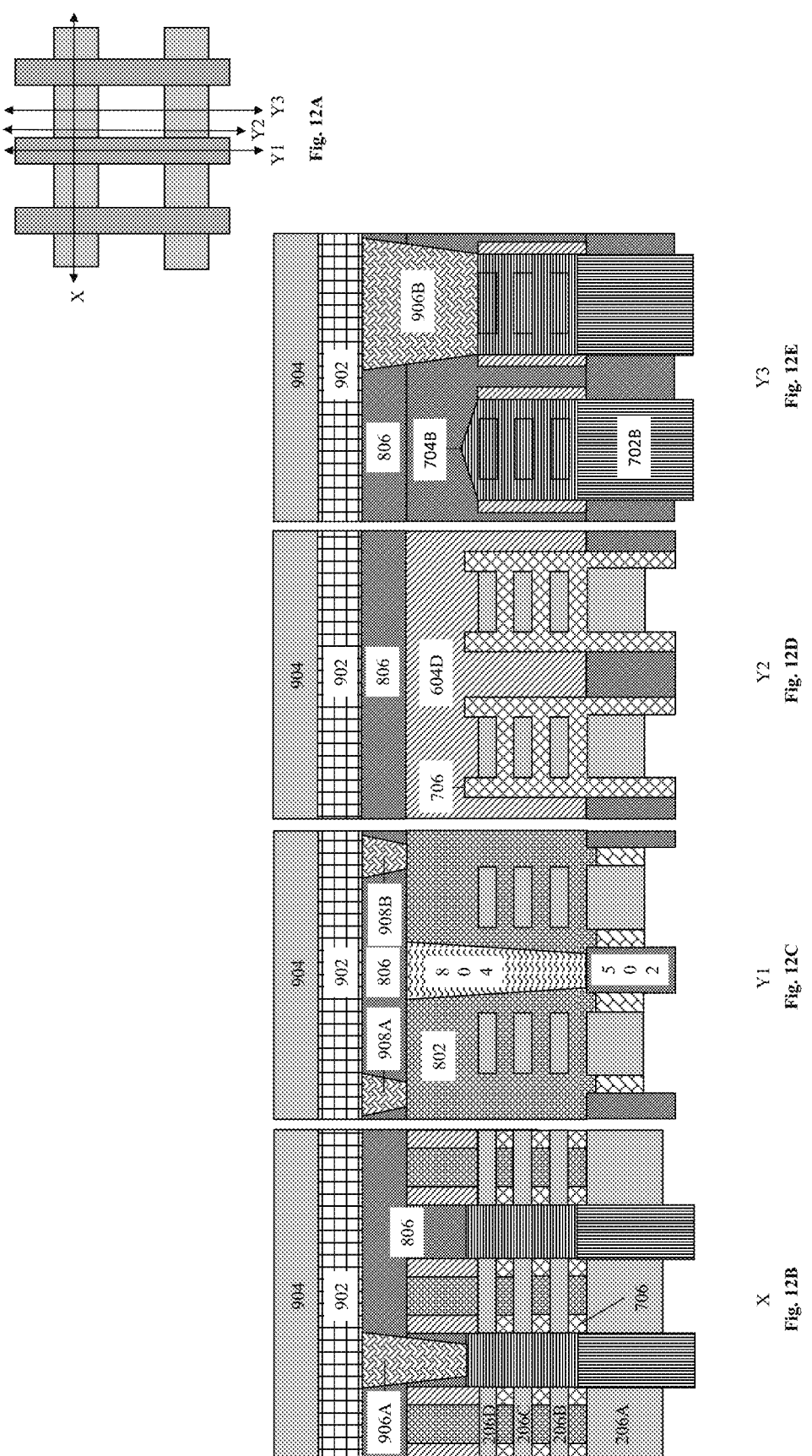

X

Y1

Y2

Y3

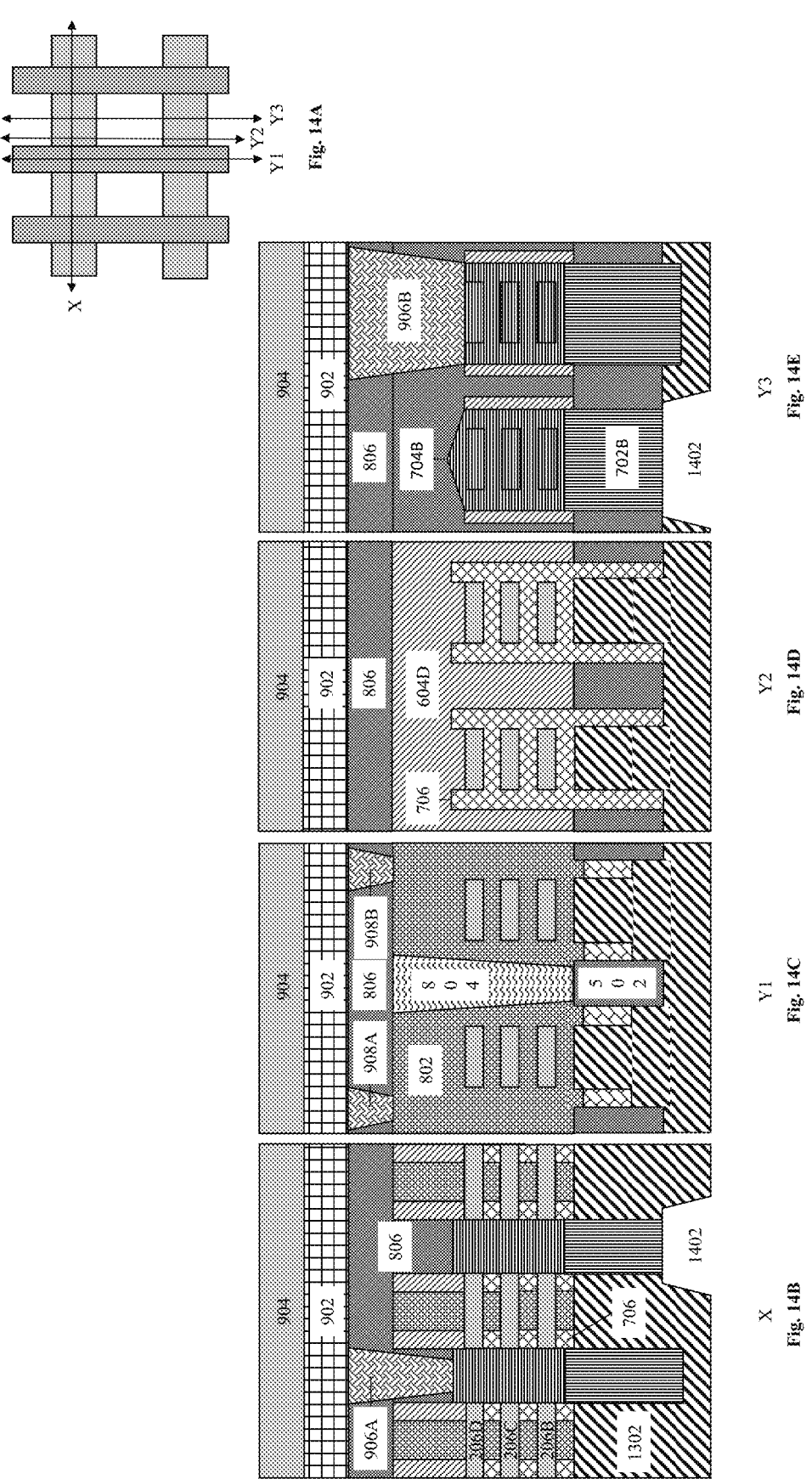

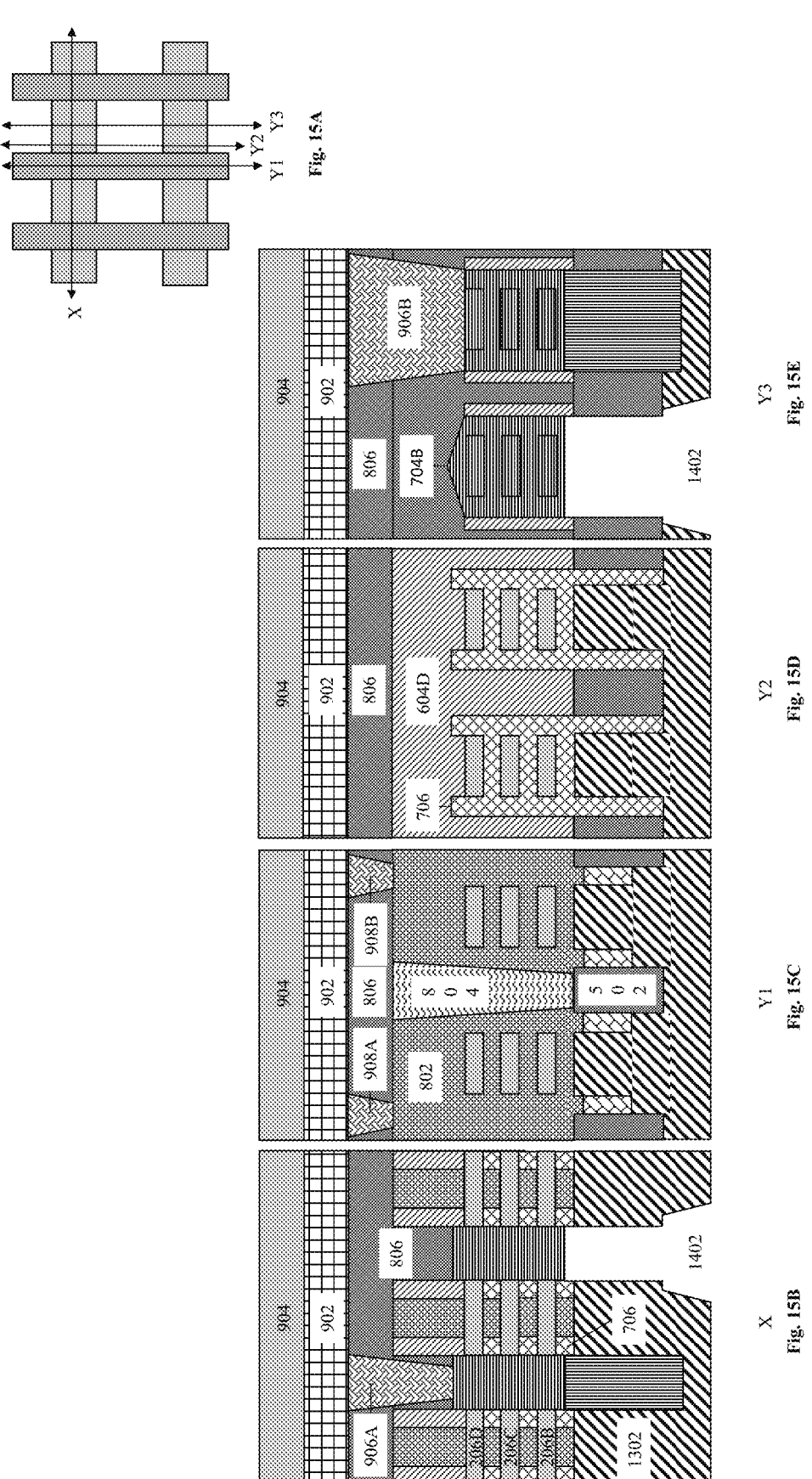

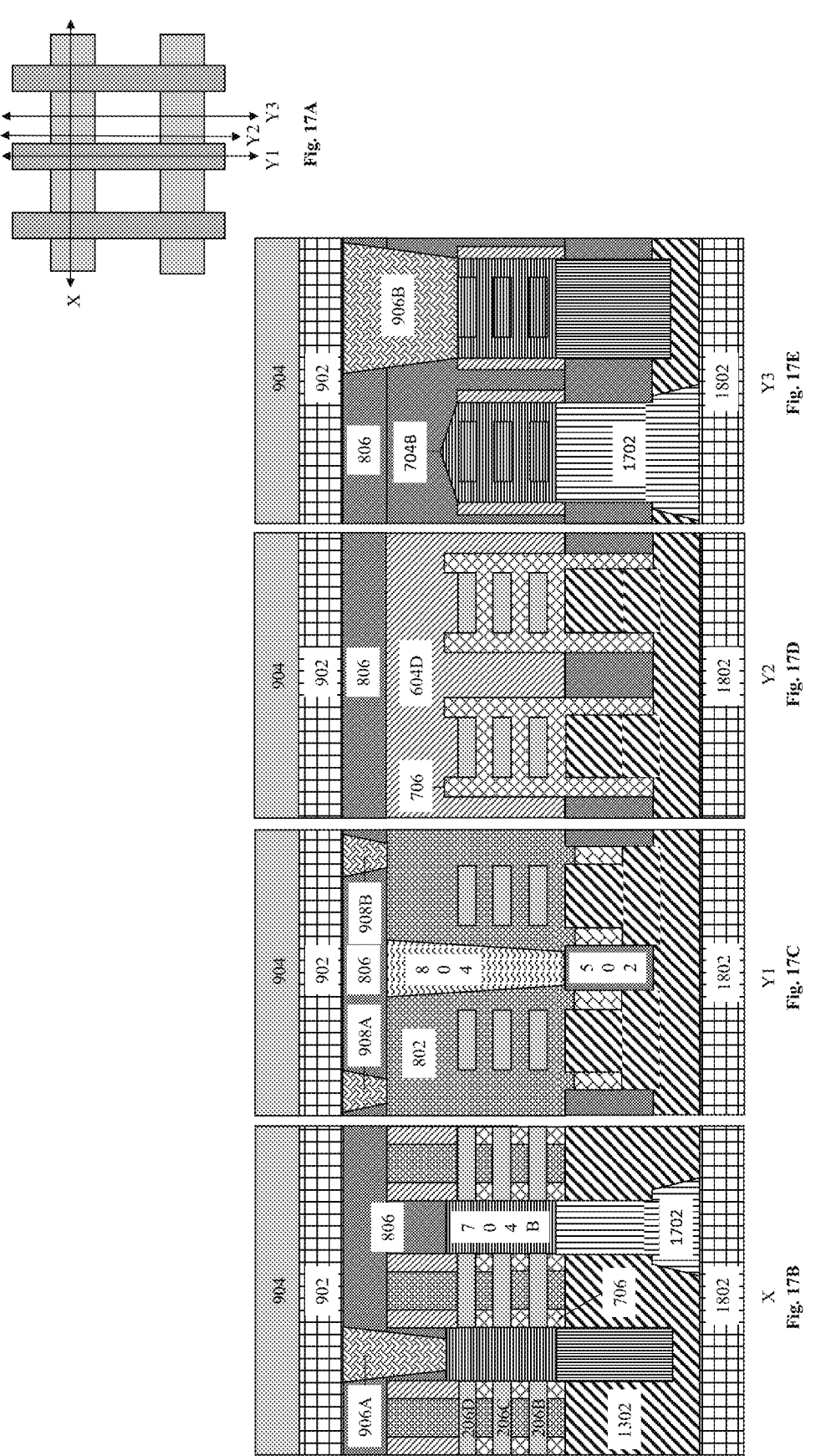

SEMICONDUCTOR CONTACT AREA MATCHING

BACKGROUND

The present disclosure relates to semiconductors, and more specifically, to semiconductors with matched contact areas for source/drain regions.

A transistor is a semiconductor structure that can include a source, a drain, and a gate. Metal contacts can be connected to the source, the drain, and the gate to apply voltages that control current flow through the transistor. However, transistors typically have significant variations between the sizes of frontside contacts and backside contacts of connected source/drain regions. The variations in the contact sizes can cause mismatched resistances between the contacts, increased parasitic impedances, threshold voltage drifts, and the like, that can degrade performance of the transistors.

SUMMARY

A method is provided according to one embodiment of the present disclosure. The method includes forming a first set of trenches in a semiconductor structure; forming a second set of trenches in the semiconductor structure; depositing inner spacers on opposite sides of a trench of the second set of trenches; and forming a source/drain region, where the inner spacers control a size of a backside contact area of the source/drain region, where the size of the backside contact area matches a size of a frontside contact area of the source/drain region.

A semiconductor structure with matched frontside and backside source/drain contact areas is provided. The semiconductor structure includes a backside contact region; a first source/drain region disposed on the backside contact region, where a shared surface between the backside contact region and a backside of the first source/drain region forms a first contact area; inner spacers disposed on opposite sides of the first source/drain region, where the inner spacers control a size of first contact area; and a frontside interlayer dielectric disposed on the first source/drain region, where a shared surface between the frontside interlayer dielectric and a frontside of the first source/drain region forms a second contact area, where the size of the first contact area matches a size of the second contact area.

BRIEF DESCRIPTION OF THE DRAWINGS

FIGS. 1A, 1B, 1C, 1D, and 1E illustrate a top view and cross-sectional views of a semiconductor structure with matched source/drain contact areas, according to one embodiment.

FIGS. 2A, 2B, and 2C illustrate a top view and cross-sectional views of a semiconductor structure under fabrication, according to one embodiment.

FIGS. 3A, 3B, and 3C illustrate a top view and cross-sectional views of a semiconductor structure under fabrication, according to one embodiment.

FIGS. 4A, 4B, and 4C illustrate a top view and cross-sectional views of a semiconductor structure under fabrication, according to one embodiment.

FIGS. 5A, 5B, and 5C illustrate a top view and cross-sectional views of a semiconductor structure under fabrication, according to one embodiment.

FIGS. 6A, 6B, 6C, 6D, and 6E illustrate a top view and cross-sectional views of a semiconductor structure under fabrication, according to one embodiment.

FIGS. 7A, 7B, 7C, 7D, and 7E illustrate a top view and cross-sectional views of a semiconductor structure under fabrication, according to one embodiment.

FIGS. 9A, 9B, 9C, 9D, and 9E illustrate a top view and cross-sectional views of a semiconductor structure under fabrication, according to one embodiment.

FIGS. 12A, 12B, 12C, 12D, and 12E illustrate a top view and cross-sectional views of a semiconductor structure under fabrication, according to one embodiment.

FIGS. 14A, 14B, 14C, 14D, and 14E illustrate a top view and cross-sectional views of a semiconductor structure under fabrication, according to one embodiment.

FIGS. 15A, 15B, 15C, 15D, and 15E illustrate a top view and cross-sectional views of a semiconductor structure under fabrication, according to one embodiment.

FIGS. 17A, 17B, 17C, 17D, and 17E illustrate a top view and cross-sectional views of a semiconductor structure under fabrication, according to one embodiment.

DETAILED DESCRIPTION

Figures 8A, 8B, 8C, 8D, 8E:
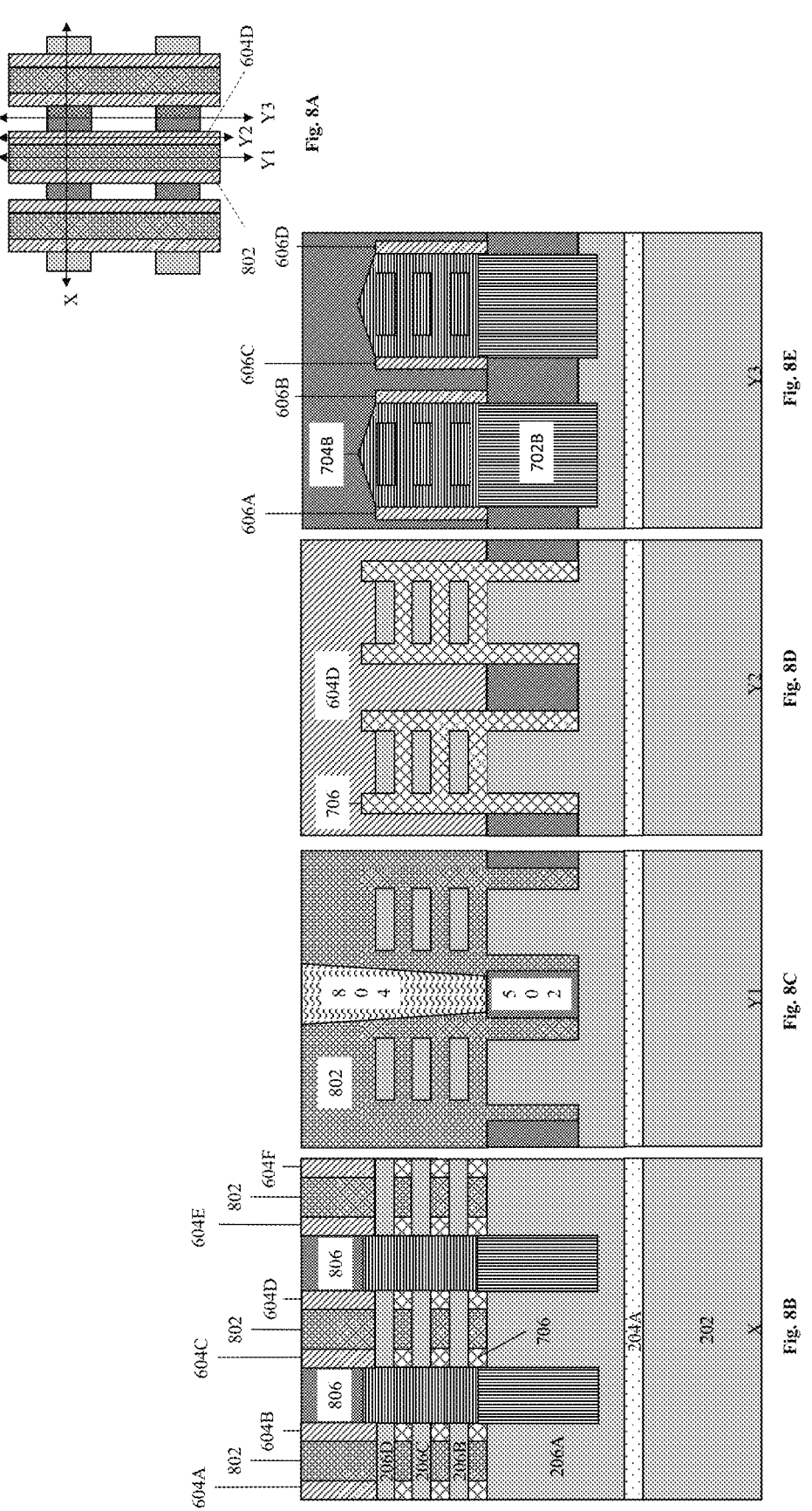
FIGS. 8A, 8B, 8C, 8D, and 8E illustrate a top view and cross-sectional views of a semiconductor structure under fabrication, according to one embodiment.

Embodiments of the present disclosure improve upon transistor operations by providing source/drain contact area matching. In one embodiment, a semiconductor structure includes inner spacers disposed on opposite sides of a source/drain region. The inner spacers are used to control the size of a backside contact area of the source/drain region, such that the size of the backside contact area can be matched to a frontside contact area of the source/drain region.

One benefit of the disclosed embodiments is to enable matched or similarly sized metal contacts at a source/drain region of a transistor, which can improve operations of the transistor. For example, embodiments of the present disclosure can provide matched contact resistance that may reduce current crowding. Further, embodiments of the present disclosure can reduce threshold voltage drifts that affect switching characteristics and operations of the transistor.

Descriptions of various embodiments of the present disclosure are presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

FIGS. 1A-1E illustrate a top view and cross-sectional views of a semiconductor structure with matched source/drain contact areas, according to one embodiment. FIG. 1A illustrates a top view of the semiconductor structure. In the illustrated embodiment, cross-section indicator X is shown traversing an active region of the semiconductor structure along an x-axis. Cross-section indicators Y1-Y3 are shown traversing various locations of the semiconductor structure along the y-axis.

FIG. 1B illustrates a cross-section of the semiconductor structure at cross-section indicator X. In the illustrated embodiment, a first source drain region (e.g., source/drain region 704A) includes a first contact area 102A on a frontside of the semiconductor structure, and a second contact area 102B on a backside of the semiconductor structure. The sizes of the first contact area 102A and the second contact area 102B can be matched such that the size of a first backside contact (not shown) can match the size of a first frontside contact (e.g., source/drain contact 906A). In one embodiment, a first placeholder (e.g., placeholder 702A) can be removed, and a backside patterning of the semiconductor can be formed, to allow the first backside contact to connect with the second contact area 102B.

FIG. 1C illustrates a cross-section of the semiconductor structure at cross-section indicator Y1. FIG. 1D illustrates a cross-section of the semiconductor structure at cross-section indicator Y2. Features of FIG. 1C and FIG. 1D are described in FIGS. 2A-17E below.

FIG. 1E illustrates a cross-section of the semiconductor structure at cross-section indicator Y3. In the illustrated embodiment, a second source drain region (e.g., source/drain region 704B) includes a third contact area 102C on a frontside of the semiconductor structure, and a fourth contact area 102D on a backside of the semiconductor structure. The sizes of the third contact area 102C and the fourth contact area 102D can be matched such that the size of a second backside contact (not shown) can match the size of a second frontside contact (not shown). In one embodiment, the second frontside contact is disposed on the third contact area 102C. The second backside contact can be connected to the second source drain region via a backside contact region 1402.

Fabrication processes to form the semiconductor structure of FIGS. 1A-1E are described in FIGS. 2A-17E below.

FIGS. 2A-2C illustrate a top view and cross-sectional views of a semiconductor structure under fabrication, according to one embodiment. FIG. 2A illustrates a top view of the semiconductor structure. In the illustrated embodiment, cross-section indicator X is shown traversing an active region of the semiconductor structure along an x-axis. Cross-section indicator Y1 is shown traversing a potential gate region of the semiconductor structure along the y-axis.

FIG. 2B illustrates a cross-section of the semiconductor structure at cross-section indicator X. FIG. 2C illustrates a cross-section of the semiconductor structure at cross-section indicator Y1. In the illustrated embodiments, the semiconductor structure includes 10 layers.

Layer 1 can include a first semiconductor layer 202. Layer 2 can include a first sacrificial layer 204A (e.g., an etch stop layer), which can be grown on layer 1. Layer 3 can include a second semiconductor layer 206A, which can be grown on layer 2. Layer 4 can include a second sacrificial layer 204B, which can be grown on layer 3. Layer 5 can include a third semiconductor layer 206B, which can be grown on layer 4. Layer 6 can include a third sacrificial layer 204C, which can be grown on layer 5. Layer 7 can include a fourth semiconductor layer 206C, which can be grown on layer 6. Layer 8 can include a fourth sacrificial layer 204D, which can be grown on layer 7. Layer 9 can include a fifth semiconductor layer 206D, which can be grown on layer 8. Layer 10 can include a hardmask, which can be disposed on layer 9. In one embodiment, the semiconductor layers and the sacrificial layers can be formed via a deposition process, an oxygen ion implantation process, or via a wafer bonding.

In one embodiment, the semiconductor layers include semiconductor material such as silicon (Si), a silicon germanium (SiGe) alloy, a silicon germanium carbide (SiGeC) alloy, germanium (Ge), III/V compound semiconductors, II/VI compound semiconductors, or the like. A given semiconductor layer of the semiconductor structure can include semiconductor material that is compositionally the same as, or compositionally different from, the semiconductor material of another semiconductor layer of the semiconductor structure.

In one embodiment, the first sacrificial layer 204A can include dielectric material such as silicon dioxide or boron nitride. A given sacrificial layer can include semiconductor material that is compositionally different from the semiconductor material of the semiconductor layers. For instance, the first semiconductor layer 202 can include silicon, the first sacrificial layer 204A can include silicon dioxide or silicon germanium, and the second semiconductor layer 206A can include silicon.

The second sacrificial layer 204B, the third sacrificial layer 204C, and the fourth sacrificial layer 204D may include silicon germanium (SiGe) having a germanium content from 20 atomic percent to 40 atomic percent. In one embodiment, the hardmask 208 is deposited via chemical or physical vapor deposition process. The hardmask 208 can include materials such as $Si_3N_4$, amorphous carbon, or the like.

FIGS. 3A-3C illustrate a top view and cross-sectional views of a semiconductor structure under fabrication, according to one embodiment. FIG. 3A illustrates a top view of the semiconductor structure. In the illustrated embodiment, cross-section indicator X is shown traversing an active region of the semiconductor structure along an x-axis. Cross-section indicator Y1 is shown traversing a potential gate region of the semiconductor structure along the y-axis.

FIG. 3B illustrates a cross-section of the semiconductor structure at cross-section indicator X. FIG. 3C illustrates a cross-section of the semiconductor structure at cross-section indicator Y1. In the embodiment illustrated in FIG. 3C, an etching process is performed to remove portions of layers 3-10 (e.g., portions of the hardmask 208, the sacrificial layers 204B-204D, and the semiconductor layers 206A-206D) of the semiconductor structure, which forms fin structures 302A-302B and trenches 304A-304C.

FIGS. 4A-4C illustrate a top view and cross-sectional views of a semiconductor structure under fabrication, according to one embodiment. FIG. 4A illustrates a top view of the semiconductor structure. In the illustrated embodiment, cross-section indicator X is shown traversing an active region of the semiconductor structure along an x-axis. Cross-section indicator Y1 is shown traversing a potential gate region of the semiconductor structure along the y-axis.

FIG. 4B illustrates a cross-section of the semiconductor structure at cross-section indicator X. FIG. 4C illustrates a cross-section of the semiconductor structure at cross-section indicator Y1. In the embodiment illustrated in FIG. 4C, sidewall spacers 404A-404D are added to the trenches 304A-304C along the sides of the fin structures 302A-302B to form sidewall spacers. The sidewall spacers 404A-404D can include materials such as SiGe, $SiO_2$, $Si_3N_4$, or the like.

A first sidewall spacer (e.g., spacer 404A) can be added to a first trench (e.g., trench 304A), and disposed on a first side of a first fin structure (e.g., fin structure 302A). A second sidewall spacer (e.g., spacer 404B) can be added to a second trench (e.g., trench 304B), and disposed on a second side of the first fin structure. A third sidewall spacer (e.g., sidewall spacers 404C) can be added to the second trench, and disposed on a first side of a second fin structure (e.g., fin structure 302B). A fourth sidewall spacer (e.g., sidewall spacers 404D) can be added to a third trench (e.g., trench 304C), and disposed on a second side of the second fin structure. In one embodiment, the sidewall spacers extend beyond a topside of the fifth semiconductor layer 206D. The spacer material may be deposited via a conformal deposition process, and subsequently anisotropically etched to remove excess spacer material on horizontal surfaces. In one embodiment, the spacer material includes SiGe.

FIGS. 5A-5C illustrate a top view and cross-sectional views of a semiconductor structure under fabrication, according to one embodiment. FIG. 5A illustrates a top view of the semiconductor structure. In the illustrated embodiment, cross-section indicator X is shown traversing an active region of the semiconductor structure along an x-axis. Cross-section indicator Y1 is shown traversing a potential gate region of the semiconductor structure along the y-axis.

FIG. 5B illustrates a cross-section of the semiconductor structure at cross-section indicator X. In the illustrated embodiment, an etching process is used to remove the hardmask 208.

FIG. 5C illustrates a cross-section of the semiconductor structure at cross-section indicator Y1. In the illustrated embodiment, a shallow trench isolation material 502 is deposited into remaining space of the trenches 304A-304C, and planarized to be level with a topside of the second semiconductor layer 206A. In one embodiment, the shallow trench isolation material 502 electrically isolates adjacent regions from cross-interference. The shallow trench isolation material 502 can include electrically insulating material such as $SiO_2$, $Si_3N_4$, or the like.

FIGS. 6A-6E illustrate a top view and cross-sectional views of a semiconductor structure under fabrication, according to one embodiment. FIG. 6A illustrates a top view of the semiconductor structure. In the illustrated embodiment, cross-section indicator X is shown traversing an active region of the semiconductor structure along an x-axis. Cross-section indicator Y1 is shown traversing a hardmask 208B of the semiconductor structure along the y-axis. Cross-section indicator Y2 is shown traversing a spacer 604D of the semiconductor structure along the y-axis. Cross-section indicator Y3 is shown traversing an active region of the semiconductor structure along the y-axis.

FIG. 6B illustrates a cross-section of the semiconductor structure at cross-section indicator X. The illustrated embodiment shows changes across the active region due to processes performed at cross-section indicators Y1 and Y2. As shown, spacers 604A-604B are disposed on opposing sides of dummy gate 602A and hardmask 208A. Spacers 604C-604D are disposed on opposing sides of dummy gate 602B and hardmask 208B. Spacers 604E-604F are disposed on opposing sides of dummy gate 602C and hardmask 208C.

In one embodiment, the spacers 604A-604F include silicon nitride (SiN), silicon oxynitride, boron nitride, SiOCN, SiBCN, SiOC, SiCN, or the like. The spacers 604A-604F can be formed via a deposition process (e.g., CVD or ALD), followed by a reactive ion etch (RIE) process.

FIG. 6C illustrates a cross-section of the semiconductor structure at cross-section indicator Y1. In the illustrated embodiment, dummy gate material is deposited over the shallow trench isolation material 502 and fin structures 302A-302B, and shaped using a CVD or photolithography process. The dummy gate material can include polysilicon. Afterwards, the hardmask 208B can be deposited on the dummy gate 602B.

FIG. 6D illustrates a cross-section of the semiconductor structure at cross-section indicator Y2. In the illustrated embodiment, a spacer material is deposited at the sides of the dummy gate 602B and the hardmask 208B. Further, an etching process can be used to form the spacer material into spacer 604D and spacer 604C (not shown, but positioned on an opposite face of the dummy gate 602B and hardmask 208B). In one embodiment, the spacer material includes dielectrics such as $Si_3N_4$, $SiO_2$, Silicon Oxynitride ($SiO_xN_y$), boron nitride, SiOCN, SiBCN, SiOC, SiCN, or the like.

FIG. 6E illustrates a cross-section of the semiconductor structure at cross-section indicator Y3. In the illustrated embodiment, when the spacer material is deposited at the sides of the dummy gate 602B and the hardmask 208B, excess spacer material (not shown) can be deposited on the sidewall of spacer 404A and spacer 404B in the active region at Y3. In one embodiment, an etching process is performed to remove the excess spacer material, and form the spacers 606A-606D.

FIGS. 7A-7E illustrate a top view and cross-sectional views of a semiconductor structure under fabrication, according to one embodiment. FIG. 7A illustrates a top view of the semiconductor structure. In the illustrated embodiment, cross-section indicator X is shown traversing an active region of the semiconductor structure along an x-axis. Cross-section indicator Y1 is shown traversing a hardmask 208B of the semiconductor structure along the y-axis. Cross-section indicator Y2 is shown traversing a spacer 604D of the semiconductor structure along the y-axis. Cross-section indicator Y3 is shown traversing a source/drain region 704B of the semiconductor structure along the y-axis.

FIG. 7B illustrates a cross-section of the semiconductor structure at cross-section indicator X. In the illustrated embodiment, an etching process is performed to remove portions of layers 3-9 of the semiconductor structure (e.g., portions of semiconductor layers 206A-206D and sacrificial layers 204B-204D), which forms trenches (not shown) between spacers 604B-604C and spacers 604D and 604E. Afterwards, an etching process can be performed to form inner spacers (e.g., inner spacer 706), as described in FIG. 7D herein.

Placeholders 702A-702B can be epitaxially grown and formed over the second semiconductor layer 206A in the trenches. In one embodiment, the placeholders 702A-702B include non-doped or intrinsic SiGe. Further, source/drain regions 704A-704B can then be epitaxially grown and formed over the placeholders 702A-702B in the trenches. In one embodiment, the source/drain regions 704A-704B include doped silicon, metal silicide, or the like.

FIG. 7C illustrates a cross-section of the semiconductor structure at cross-section indicator Y1. In the illustrated embodiment, to aid in comparison, sidewall spacers 404A-404B are shown prior to an etching process that forms inner spacers (e.g., inner spacer 706) in place of the sidewall spacers 404A-404B.

FIG. 7D illustrates a cross-section of the semiconductor structure at cross-section indicator Y2. In the embodiment illustrated in FIG. 7D, the etch process is performed to remove portions of the sidewall spacers 404A-404B. The etch process is continued to remove portions of the sacrificial layers 204B-204D between the sidewall spacers 404A-

404B. Afterwards, an inner spacer material is deposited to fill the space left by the material removed by the etching process. In one embodiment, the inner spacer material includes $Si_3N_4$, $SiO_2$, $SiO_xNy$, or the like. In this manner, inner spacer 706 is formed, which separates the second semiconductor layer 206A and the shallow trench isolation material 502, and separates semiconductor layers 206B-206D disposed on portions of the inner spacer 706.

FIG. 7E illustrates a cross-section of the semiconductor structure at cross-section indicator Y3. The illustrated embodiment shows a resultant structure after the formation of the inner spacer 706. The source/drain region 704B is disposed on the placeholder 702B, and between opposing spacers (e.g., spacers 606A-606C). Further, nanosheets are formed as a result of the separation of the semiconductor layers 206B-206D by the inner spacer 706. A similar source/drain region and nanosheets are formed between opposing spacers (e.g., spacers 606C-606D).

FIGS. 8A-8E illustrate a top view and cross-sectional views of a semiconductor structure under fabrication, according to one embodiment. FIG. 8A illustrates a top view of the semiconductor structure. In the illustrated embodiment, cross-section indicator X is shown traversing an active region of the semiconductor structure along an x-axis. Cross-section indicator Y1 is shown traversing high-k metal gate material 802 of the semiconductor structure along the y-axis. Cross-section indicator Y2 is shown traversing a spacer 604D of the semiconductor structure along the y-axis. Cross-section indicator Y3 is shown traversing a shallow trench isolation material 502 of the semiconductor structure along the y-axis.

FIG. 8B illustrates a cross-section of the semiconductor structure at cross-section indicator X. In the illustrated embodiment, an interlayer dielectric (ILD) 806 is deposited over the source/drain regions 704A-704B between opposing spacers (e.g., between spacers 604B-604C, and between spacers 604D-604F). In one embodiment, the ILD 806 includes $SiO_2$, SiN, undoped silicate glass (USG), fluorosilicate glass (FSG), borophosphosilicate glass (BPSG), a spin-on low-k dielectric layer, a chemical vapor deposition (CVD) low-k dielectric layer, or the like. The term "low-k" may be referenced herein to describe a dielectric material that has a dielectric constant of less than 4.0.

High-k metal gates can be formed, as described in FIG. 8C herein. Afterwards, a planarization process can be performed to level a topside of the spacers 604A-604F, the high-k metal gate material 802, and the ILD 806.

FIG. 8C illustrates a cross-section of the semiconductor structure at cross-section indicator Y1. In the illustrated embodiment, an etching process can be performed to remove remaining portions of the sacrificial layers 204B-204D, remaining portions of the sidewall spacers 404A-404B, the dummy gate 602B, and the hardmask 208B. High-k metal gate material 802 can then be deposited over the second semiconductor layer 206A and the shallow trench isolation material 502 to develop metal gate formations.

In one embodiment, the high-k metal gate material 802 includes a high-k dielectric material and gate conductor. Examples of high-k dielectric material includes metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, silicon oxide, silicon nitride, silicon oxynitride, or the like. The high-k dielectric material may further include dopants such as lanthanum, aluminum, magnesium, or the like.

The high-k metal gate material 802 can be deposited by chemical vapor deposition (CVD), atomic layer deposition (ALD), or the like. The gate conductor can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or the like. The gate conductor may further comprise dopants that are incorporated during or after deposition. In one embodiment, the gate conductor includes a work function metal layer to set a threshold voltage of the transistor to a desired value. The work function layer may include a nitride, such as titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), or the like; or a carbide, such as titanium carbide (TiC), titanium aluminum carbide (TiAlC), tantalum carbide (TaC), hafnium carbide (HfC), or the like. The gate conductor can be formed by using a conformal deposition process such as atomic layer deposition (ALD), chemical vapor deposition (CVD), physical vapor deposition (PVD), or sputtering processing, or the like.

Additional hardmasks (not shown) can be added to aid in forming a gate cut 804. In one embodiment, an etching process forms the gate cut from a top surface of the high-k metal gate material 802 (post-planarization) to the shallow trench isolation material 502. The gate cut 804 can be filled with a dielectric material (e.g., silicon nitride) to separate the high-k metal gate material 802 into separate metal gate formations.

FIG. 8D illustrates a cross-section of the semiconductor structure at cross-section indicator Y2. The illustrated embodiment depicts a planarization of the cross-section shown in FIG. 7D.

FIG. 8E illustrates a cross-section of the semiconductor structure at cross-section indicator Y3. As previously discussed, an ILD 806 can be deposited over the source/drain regions 704A-704B between opposing spacers (e.g., between spacers 604B-604C, and between spacers 604D-604F). The illustrated embodiment depicts a planarization of the cross-section shown in FIG. 7E.

FIGS. 9A-9E illustrate a top view and cross-sectional views of a semiconductor structure under fabrication, according to one embodiment. FIG. 9A illustrates a top view of the semiconductor structure. In the illustrated embodiment, cross-section indicator X is shown traversing an active region of the semiconductor structure along an x-axis. Cross-section indicators Y1-Y3 are shown traversing a carrier wafer 904 at various locations of the semiconductor structure along the y-axis.

FIG. 9B illustrates a cross-section of the semiconductor structure at cross-section indicator X. In the illustrated embodiment, a first source/drain contact (e.g., source/drain contact 906A) is disposed on source/drain region 704A. In one embodiment, the source/drain contact 906A includes a metal silicide, copper (Cu), tungsten (W), nickel (Ni), cobalt (Co), or the like. Other contacts can be added to the semiconductor structure as described in FIGS. 9C-9E herein. Afterwards, a back-end-of-line (BEOL) interconnect 902 can be disposed on the contacts and ILD 806. The BEOL layer may include conductive vias and conductive lines that make electrical contact with devices connected to a front-end-of-line (FEOL) structure. Additional BEOL layers (not shown) may be formed on the BEOL interconnect 902, such as conductive vias and lines that form power and signal distribution networks to serve the devices connected to the FEOL structure. Further, a carrier wafer bonding process can be performed to connect the BEOL interconnect 902 to a carrier wafer 904.

FIG. 9C illustrates a cross-section of the semiconductor structure at cross-section indicator Y1. In the illustrated embodiment, gate contacts 908A-908B are disposed on the separate metal gate formations. Further, the BEOL interconnect 902 is shown as being disposed on gate contacts 908A-908B and the ILD 806, and the carrier wafer 904 is shown as being bonded to the BEOL interconnect 902.

FIG. 9D illustrates a cross-section of the semiconductor structure at cross-section indicator Y2. As shown in the illustrated embodiment, the ILD 806 is disposed on the spacer 604D, the BEOL interconnect 902 is disposed on the ILD 806, and the carrier wafer is bonded to the BEOL interconnect 902.

FIG. 9E illustrates a cross-section of the semiconductor structure at cross-section indicator Y3. In the illustrated embodiment, a source/drain contact (e.g., source/drain contact 906B) is disposed on a source/drain region. Further, the BEOL interconnect 902 is shown as being disposed on source/drain contact 906B and the ILD 806, and the carrier wafer 904 is shown as being bonded to the BEOL interconnect 902.

Figures 10A, 10B, 10C, 10D, 10E:
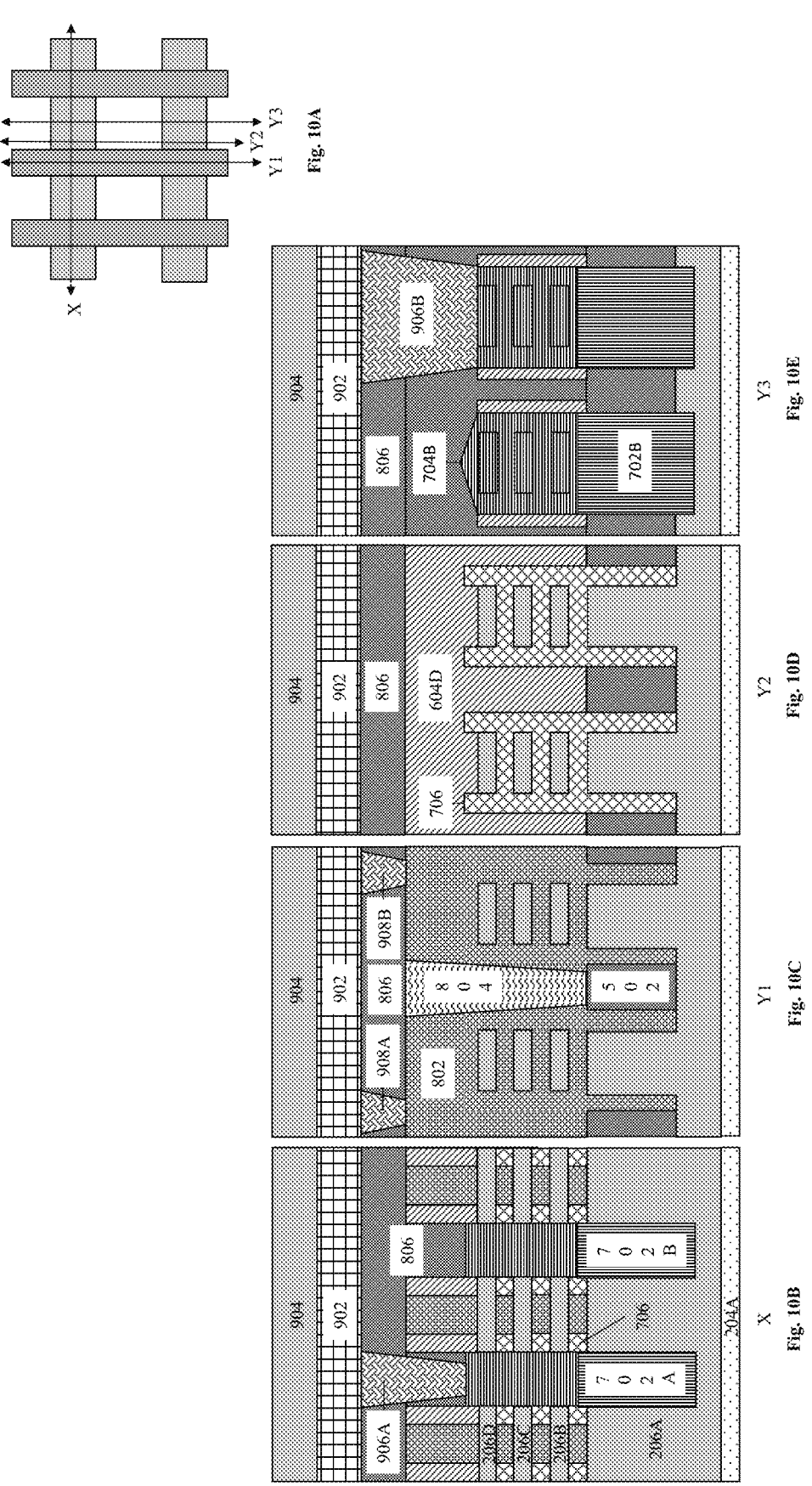
FIGS. 10A, 10B, 10C, 10D, and 10E illustrate a top view and cross-sectional views of a semiconductor structure under fabrication, according to one embodiment.

FIGS. 10A-10E illustrate a top view and cross-sectional views of a semiconductor structure under fabrication, according to one embodiment. FIG. 10A illustrates a top view of the semiconductor structure. In the illustrated embodiment, cross-section indicator X is shown traversing an active region of the semiconductor structure along an x-axis. Cross-section indicators Y1-Y3 are shown traversing a carrier wafer 904 at various locations of the semiconductor structure along the y-axis.

FIG. 10B illustrates a cross-section of the semiconductor structure at cross-section indicator X. In one embodiment, the semiconductor structure is flipped to provide access to further process the first semiconductor layer 202. However, for consistency in the illustrations, the illustrated embodiment retains the orientation of the semiconductor structure from the preceding figures. In the illustrated embodiment, the first semiconductor layer 202 is removed, which exposes the first sacrificial layer 204A.

FIG. 10C illustrates a cross-section of the semiconductor structure at cross-section indicator Y1. FIG. 10D illustrates a cross-section of the semiconductor structure at cross-section indicator Y2. FIG. 10E illustrates a cross-section of the semiconductor structure at cross-section indicator Y3. The changes described in FIG. 10B herein are reflected in FIGS. 10C-10E.

Figures 11A, 11B, 11C, 11D, 11E:
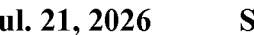
FIGS. 11A, 11B, 11C, 11D, and 11E illustrate a top view and cross-sectional views of a semiconductor structure under fabrication, according to one embodiment.

FIGS. 11A-11E illustrate a top view and cross-sectional views of a semiconductor structure under fabrication, according to one embodiment. FIG. 11A illustrates a top view of the semiconductor structure. In the illustrated embodiment, cross-section indicator X is shown traversing an active region of the semiconductor structure along an x-axis. Cross-section indicators Y1-Y3 are shown traversing a carrier wafer 904 at various locations of the semiconductor structure along the y-axis.

FIG. 11B illustrates a cross-section of the semiconductor structure at cross-section indicator X. In the illustrated embodiment, the first sacrificial layer 204A is removed. Further, an etch process is performed to further recess the second semiconductor layer 206A. The material compositions of the placeholders 702A-702B prevent the placeholders 702A-702B from being etched.

FIG. 11C illustrates a cross-section of the semiconductor structure at cross-section indicator Y1. In the illustrated embodiment, the portions of the second semiconductor layer 206A are selectively removed while leaving the shallow trench isolation material 502 and the high-k metal gate unchanged.

FIG. 11D illustrates a cross-section of the semiconductor structure at cross-section indicator Y2. FIG. 11E illustrates a cross-section of the semiconductor structure at cross-section indicator Y3. The changes described in FIGS. 11B-11C herein are reflected in FIGS. 11D-11E.

FIGS. 12A-12E illustrate a top view and cross-sectional views of a semiconductor structure under fabrication, according to one embodiment. FIG. 12A illustrates a top view of the semiconductor structure. In the illustrated embodiment, cross-section indicator X is shown traversing an active region of the semiconductor structure along an x-axis. Cross-section indicators Y1-Y3 are shown traversing a carrier wafer 904 at various locations of the semiconductor structure along the y-axis.

FIG. 12B illustrates a cross-section of the semiconductor structure at cross-section indicator X. FIG. 12C illustrates a cross-section of the semiconductor structure at cross-section indicator Y1. As shown in FIG. 11C, the high-k metal gate material 802 is exposed, and can form a short with a contact that is added to the backside of the semiconductor structure. Therefore, the high-k metal gate material 802 can be isolated to prevent the short from forming. In one embodiment, an etching process is performed to recess the high-k metal gate material 802, thereby forming a cavity or a recessed space. Afterwards, the recessed space can be filled with an inner spacer material to form gate spacers.

FIG. 12D illustrates a cross-section of the semiconductor structure at cross-section indicator Y2. FIG. 12E illustrates a cross-section of the semiconductor structure at cross-section indicator Y3. In one embodiment, no changes are seen from the perspectives illustrated in FIG. 12B and FIGS. 12C-12D.

Figures 13A, 13B, 13C, 13D, 13E:
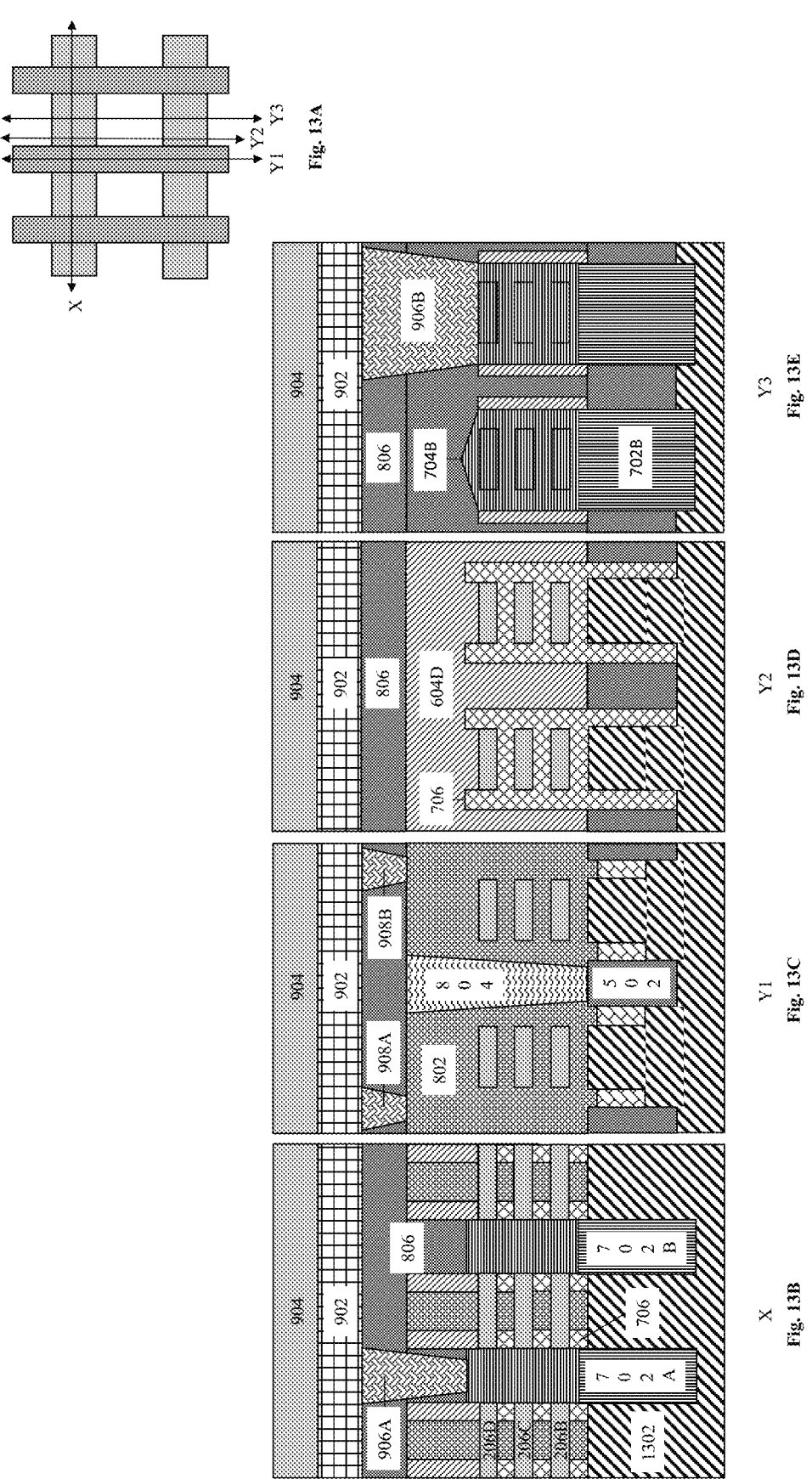
FIGS. 13A, 13B, 13C, 13D, and 13E illustrate a top view and cross-sectional views of a semiconductor structure under fabrication, according to one embodiment.

FIGS. 13A-13E illustrate a top view and cross-sectional views of a semiconductor structure under fabrication, according to one embodiment. FIG. 13A illustrates a top view of the semiconductor structure. In the illustrated embodiment, cross-section indicator X is shown traversing an active region of the semiconductor structure along an x-axis. Cross-section indicators Y1-Y3 are shown traversing a carrier wafer 904 at various locations of the semiconductor structure along the y-axis.

FIG. 13B illustrates a cross-section of the semiconductor structure at cross-section indicator X. In the illustrated embodiment, an etching process is performed to remove the second semiconductor layer 206A. Afterwards, an ILD (e.g., backside ILD 1302) is deposited on a backside of the high-k metal gate material 802, inner spacers (e.g., inner spacer 706), and placeholders 702A-702B.

FIG. 13C illustrates a cross-section of the semiconductor structure at cross-section indicator Y1. FIG. 13D illustrates a cross-section of the semiconductor structure at cross-section indicator Y2. FIG. 13E illustrates a cross-section of the semiconductor structure at cross-section indicator Y3. The changes described in FIG. 13B herein are reflected in FIGS. 13C-13E.

FIGS. 14A-14E illustrate a top view and cross-sectional views of a semiconductor structure under fabrication, according to one embodiment. FIG. 14A illustrates a top view of the semiconductor structure. In the illustrated embodiment, cross-section indicator X is shown traversing an active region of the semiconductor structure along an x-axis. Cross-section indicators Y1-Y3 are shown traversing a carrier wafer 904 at various locations of the semiconductor structure along the y-axis.

FIG. 14B illustrates a cross-section of the semiconductor structure at cross-section indicator X. The backside interlayer dielectric (ILD) 1302 may be patterned via a photolithographic process to form an opening that exposes a bottom of the placeholders 702A-702B. In the illustrated embodiment, an etching process is performed to form a backside contact region 1402 in the backside ILD 1302.

FIG. 14C illustrates a cross-section of the semiconductor structure at cross-section indicator Y1. FIG. 14D illustrates a cross-section of the semiconductor structure at cross-section indicator Y2. FIG. 14E illustrates a cross-section of the semiconductor structure at cross-section indicator Y3. The changes described in FIG. 14B herein are reflected in FIGS. 14C-14E.

FIGS. 15A-15E illustrate a top view and cross-sectional views of a semiconductor structure under fabrication, according to one embodiment. FIG. 15A illustrates a top view of the semiconductor structure. In the illustrated embodiment, cross-section indicator X is shown traversing an active region of the semiconductor structure along an x-axis. Cross-section indicators Y1-Y3 are shown traversing a carrier wafer 904 at various locations of the semiconductor structure along the y-axis.

FIG. 15B illustrates a cross-section of the semiconductor structure at cross-section indicator X. In the illustrated embodiment, the placeholder 702B can be removed to extend the backside contact region 1402. In one embodiment, an etching process (e.g., wet or dry isotropic chemical etch) is performed to remove the placeholder 702B.

As shown, the contact area of the backside of the source/drain region 704B is matched to a contact area frontside of the source/drain region 704B. Similar matched contact areas can be formed for the frontside and backside of given source/drain regions to provide for matched or uniform contact sizes at the source/drain regions of the semiconductor structure.

FIG. 15C illustrates a cross-section of the semiconductor structure at cross-section indicator Y1. FIG. 15D illustrates a cross-section of the semiconductor structure at cross-section indicator Y2. FIG. 15E illustrates a cross-section of the semiconductor structure at cross-section indicator Y3. The changes described in FIG. 15B herein are reflected in FIGS. 15C-15E.

Figures 16A, 16B, 16C, 16D, 16E:
FIGS. 16A, 16B, 16C, 16D, and 16E illustrate a top view and cross-sectional views of a semiconductor structure under fabrication, according to one embodiment.

FIGS. 16A-16E illustrate a top view and cross-sectional views of a semiconductor structure under fabrication, according to one embodiment. FIG. 16A illustrates a top view of the semiconductor structure. In the illustrated embodiment, cross-section indicator X is shown traversing an active region of the semiconductor structure along an x-axis. Cross-section indicators Y1-Y3 are shown traversing a carrier wafer 904 at various locations of the semiconductor structure along the y-axis.

FIG. 16B illustrates a cross-section of the semiconductor structure at cross-section indicator X. In the illustrated embodiment, a backside metal contact 1702 is disposed on the source/drain region 704B. As shown, the size of the contact surface of the backside metal contact 1702 with the source/drain region 704B can be matched to a contact disposed on a frontside of the source/drain region. Further, matched or uniform source/drain contact areas can be provided for given source/drain regions (e.g., source/drain regions 704A-704B) such that contacts disposed on different source/drain regions can have similar surface area contact (e.g., source/drain contact 906B and backside metal contact 1702).

FIG. 16C illustrates a cross-section of the semiconductor structure at cross-section indicator Y1. FIG. 16D illustrates a cross-section of the semiconductor structure at cross-section indicator Y2. FIG. 16E illustrates a cross-section of the semiconductor structure at cross-section indicator Y3. The changes described in FIG. 16B herein are reflected in FIGS. 16C-16E.

FIGS. 17A-17E illustrate a top view and cross-sectional views of a semiconductor structure under fabrication, according to one embodiment. FIG. 17A illustrates a top view of the semiconductor structure. In the illustrated embodiment, cross-section indicator X is shown traversing an active region of the semiconductor structure along an x-axis. Cross-section indicators Y1-Y3 are shown traversing a carrier wafer 904 at various locations of the semiconductor structure along the y-axis.

FIG. 17B illustrates a cross-section of the semiconductor structure at cross-section indicator X. In the illustrated embodiment, a backside interconnect layer 1802 is disposed on the backside ILD 1302 and the backside metal contact 1702 to connect the semiconductor structure to an integrated circuit.

FIG. 17C illustrates a cross-section of the semiconductor structure at cross-section indicator Y1. FIG. 17D illustrates a cross-section of the semiconductor structure at cross-section indicator Y2. FIG. 17E illustrates a cross-section of the semiconductor structure at cross-section indicator Y3. The changes described in FIG. 17B herein are reflected in FIGS. 17C-17E.

Various embodiments of the present disclosure are described herein with reference to the related drawings. Alternative embodiments can be devised without departing from the scope of this disclosure. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Embodiments of the present disclosure may reference an interlayer dielectric (ILD) material. The ILD material can be an insulating material used to electrically isolate different layers of a semiconductor structure. The ILD material can be $SiO_2$, SiN, a low-k dielectric material, or an ultra-low-k dielectric material. Low-k dielectric materials may generally include dielectric materials having a k value of about 3.9 or less. The ultralow-k dielectric material generally includes dielectric materials having a k value less than 2.5. Unless otherwise noted, all k values mentioned in the present application are measured relative to a vacuum. Ultra-low-k dielectric materials can include porous materials such as porous organic silicate glasses, porous polyamide nano-foams, silica xerogels, porous hydrogen silsequioxane (HSQ), porous methylsilsesquioxane (MSQ), porous inorganic materials, porous CVD materials, porous organic materials, or combinations thereof. The ultra-low-k dielectric material can be produced using a templated process or a sol-gel process. In the templated process, a precursor typically contains a composite of thermally labile and stable materials. After film deposition, the thermally labile materials can be removed by thermal heating, leaving pores in the dielectric film. In the sol gel process, porous low-k dielectric films can be formed by hydrolysis and polycondensation of an alkoxide(s) such as tetraetehoxysilane (TEOS).

Embodiments of the present disclosure may reference p-type or n-type semiconductor structures. "P-type" can refer to the addition of impurities to an intrinsic semiconductor that creates deficiencies of valence electrons. In a silicon-containing substrate, examples of p-type dopants (i.e., impurities) include, but are not limited to, boron, aluminum, gallium and indium. "N-type" can refer to the addition of impurities that contributes free electrons to an intrinsic semiconductor. In a silicon containing substrate examples of n-type dopants (i.e., impurities) include, but are not limited to, antimony, arsenic and phosphorous.

Various processes used to form a semiconductor structure that will be packaged into an IC fall into four general categories: film deposition, removal/etching, semiconductor doping and patterning/lithography. Deposition is any process that grows, coats, or otherwise transfers a material onto the wafer. Examples of such technologies include physical vapor deposition (PVD), chemical vapor deposition (CVD), plasma enhanced chemical vapor deposition (PECVD), electrochemical deposition (ECD), atomic layer deposition (ALD), epitaxial growth/deposition, or the like. The term "epitaxial growth/deposition" may reference growth of a first semiconductor material on a surface of a second semiconductor material, in which the first semiconductor material has the same crystalline characteristics as the surface of the second semiconductor material. In an epitaxial growth process, chemical reactants provided by source gases are controlled, and system parameters are set so that deposited atoms are disposed on the surface of the second semiconductor material with sufficient energy to traverse the surface and orient to a crystal arrangement of atoms of the surface. Examples of epitaxial growth/deposition process techniques include rapid thermal chemical vapor deposition q(RT-CVD), low-energy plasma deposition (LEPD), ultra-high vacuum chemical vapor deposition (UHVCVD), atmospheric pressure chemical vapor deposition (APCVD), molecular beam epitaxy (MBE), or the like.

Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, transistors can be built and wired together to form the circuitry of a modern semiconductor device.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation, or the like. Afterwards, the exposed photoresist is developed utilizing a conventional resist development process.

Following the development step, the etching step can be performed to transfer the pattern from the patterned photoresist into the interlayer dielectric. The etching step used in forming the at least one opening can include a dry etching process (e.g., reactive ion etching, ion beam etching, plasma etching, or laser ablation), a wet chemical etching process, or any combination thereof.

While the foregoing is directed to embodiments of the present disclosure, other and further embodiments of the present disclosure may be devised without departing from the basic scope thereof, and the scope thereof is determined by the claims that follow.

The invention claimed is:

1. A method comprising:

forming a plurality of semiconductor layers and sacrificial layers alternately in a semiconductor structure;

forming a first set of trenches in the semiconductor structure;

forming a second set of trenches in the semiconductor structure;

depositing inner spacers on opposite sides of a trench of the second set of trenches; and forming a source/drain region, growing a placeholder in the second set of trenches;

growing the source/drain region over the placeholder; and forming a backside contact region;

removing the placeholder to extend the backside contact region; and wherein the inner spacers control a size of a backside contact area of the source/drain region, wherein the size of the backside contact area matches a size of a frontside contact area of the source/drain region.

2. The method of claim 1, wherein the plurality of semiconductor layers and sacrificial layers semiconductor structure include:

a first semiconductor layer, a first sacrificial layer disposed on the first semiconductor layer, a second semiconductor layer disposed on the first sacrificial layer, a second sacrificial layer disposed on the second semiconductor layer, a third semiconductor layer disposed on the second sacrificial layer, a third sacrificial layer disposed on the third semiconductor layer, a fourth semiconductor layer disposed on the third sacrificial layer, a fourth sacrificial layer disposed on the fourth semiconductor layer, and a fifth semiconductor layer disposed on the fourth sacrificial layer.

3. The method of claim 2, wherein forming the source/drain region further comprises:

growing a placeholder in the second set of trenches;

growing the source/drain region over the placeholder; and depositing an interlayer dielectric over the source/drain region.

4. The method of claim 3, wherein forming the first set of trenches forms a fin structure, and wherein forming the first set of trenches comprises:

depositing sidewall spacers to opposite faces of the fin structure;

depositing a shallow trench isolation material in the first set of trenches;

depositing a dummy gate material over the shallow trench isolation material and the fin structure; and depositing spacers on opposite faces of the dummy gate material.

5. The method of claim 4, further comprising:

removing the dummy gate material;

removing the sidewall spacers;

removing a portion of the second sacrificial layer between the sidewall spacers;

removing a portion of the third sacrificial layer between the sidewall spacers;

removing a portion of the fourth sacrificial layer between the sidewall spacers;

depositing high-k metal gate material in a space left by the removal of the dummy gate material, the sidewall spacers, the second sacrificial layer, the third sacrificial layer, and the fourth sacrificial layer; and forming a gate cut through the high-k metal gate material.

6. The method of claim 5, further comprising:

disposing a gate contact on the high-k metal gate material;

disposing a source/drain contact on a frontside of the source/drain region;

disposing a back-end-of-line interconnect on the gate contact, the source/drain contact, and another interlayer dielectric; and bonding the semiconductor structure to a carrier wafer, wherein the carrier wafer is bonded to the back-end-of-line interconnect.

7. The method of claim 6, further comprising:

removing the first semiconductor layer of the semiconductor structure;

removing the first sacrificial layer of the semiconductor structure;

removing a portion of the second semiconductor layer to expose the high-k metal gate material;

removing a portion of the exposed high-k metal gate material to form a cavity; and filling the cavity with an inner spacer material.

8. The method of claim 7, further comprising:

depositing a backside interlayer dielectric on a backside of the placeholder and the inner spacer material;

forming a backside contact region;

removing the placeholder to extend the backside contact region, wherein the backside contact region extends from a backside of the source/drain region to an end of the backside contact region; and disposing a backside metal contact on the backside of the source/drain region.

9. The method of claim 2, wherein the first set of trenches extend from the second semiconductor layer to the fifth semiconductor layer, and wherein the second set of trenches extend from the second semiconductor layer to the fifth semiconductor layer.

10. The method of claim 4, wherein the sidewall spacers extend from the second semiconductor layer to the fifth semiconductor layer.

* * * * *